United States Patent [19]
Sesekura et al.

[11] Patent Number: 5,949,343
[45] Date of Patent: Sep. 7, 1999

[54] SUPERVISORY APPARATUS FOR OIL-FILLED ELECTRICAL EQUIPMENT

[75] Inventors: Takashi Sesekura; Yuji Hase; Satoru Inoue; Takashi Hirai; Takashi Shindoi, all of Tokyo, Japan

[73] Assignee: Mitsubishi Denki Kabushiki Kaisha, Tokyo, Japan

[21] Appl. No.: 09/057,399

[22] Filed: Apr. 9, 1998

[30] Foreign Application Priority Data

Nov. 14, 1997 [JP] Japan .................................. 9-313600

[51] Int. Cl.$^6$ .................................................. G08B 21/00
[52] U.S. Cl. .......................... 340/683; 340/646; 340/650; 361/36; 361/37
[58] Field of Search ..................... 340/626, 682, 340/683, 646, 650; 73/862.54, 862.58, 593; 361/35, 36, 37, 38

[56] References Cited

U.S. PATENT DOCUMENTS

| | | | |
|---|---|---|---|
| 4,215,404 | 7/1980 | Bukhtiyarov et al. | 701/111 |
| 4,406,169 | 9/1983 | Ikeuchi et al. | 340/682 |
| 4,752,697 | 6/1988 | Lyons et al. | 290/2 |
| 5,684,298 | 11/1997 | O'Connor et al. | 250/231.1 |
| 5,703,295 | 12/1997 | Ishida et al. | 340/683 |

FOREIGN PATENT DOCUMENTS

55-147917  11/1980  Japan .

*Primary Examiner*—Jeffery A. Hofsass
*Assistant Examiner*—Van T. Trieu
*Attorney, Agent, or Firm*—Leydig, Voit & Mayer, Ltd.

[57] ABSTRACT

There is provided at least one pressure detector for detecting a change in pressure of an insulating medium, a vibration detector for detecting vibration of an oil-filled electric equipment, and a determination processor for determining, based on information detected by the pressure detector and the vibration detector, whether an internal short circuit has occurred in the oil-filled electrical equipment.

20 Claims, 8 Drawing Sheets

PRIOR ART

SUPERVISORY APPARATUS FOR OIL-FILLED ELECTRICAL EQUIPMENT

FIELD OF THE INVENTION

The present invention relates to a supervisory apparatus for detecting internal short-circuits in oil-filled electrical equipment with a medium such as an insulating oil sealed therein.

BACKGROUND

Figure 8:
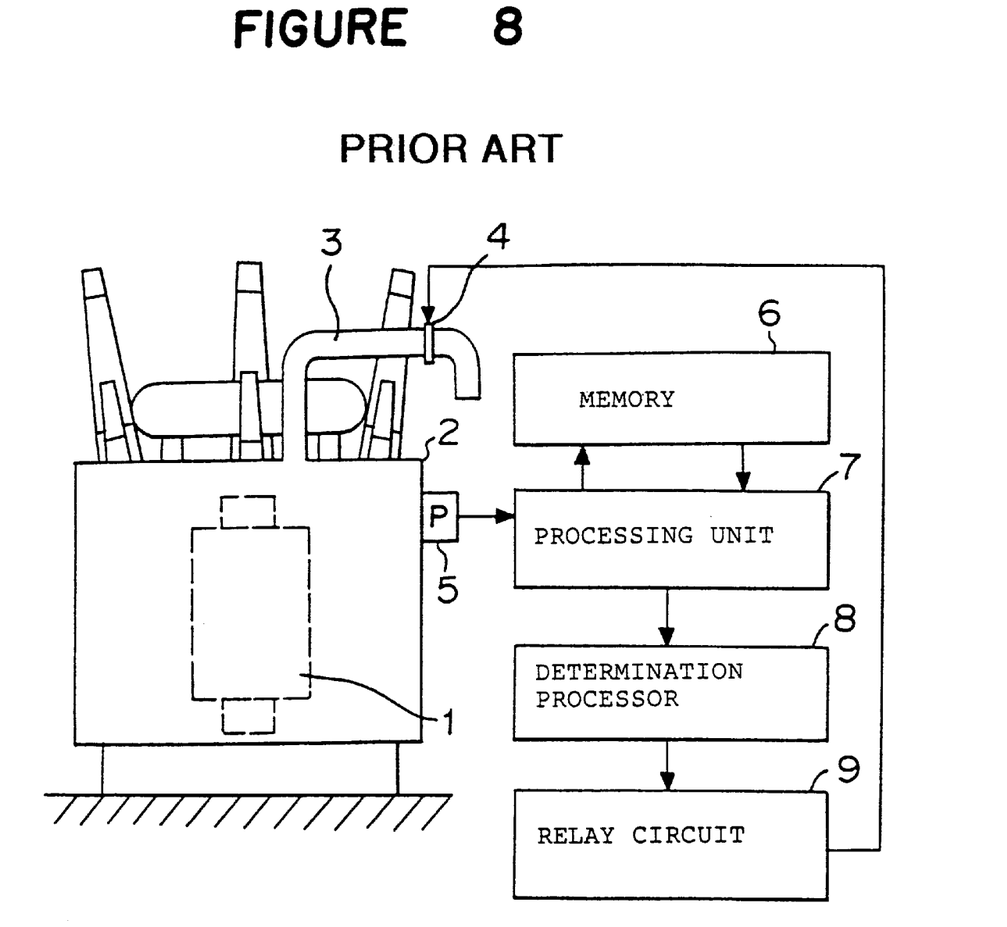
FIG. 8 is a schematic view showing a conventional supervisory apparatus for an oil-filled electrical equipment.

In FIG. 8 is shown a schematic view of a conventional supervisory apparatus for an oil-filled electrical equipment, which has been disclosed in, JP-B-6111054. In this Figure, reference numeral 1 designates a transformer, reference numeral 2 designates an oil-filled enclosure which has, e.g., oil as an insulating medium for the transformer 1 therein, reference numeral 3 designates a pressure releasing pipe which breaks a pressure releasing plate 4 to remove the oil outside so as to depressurize the inside of the oil-filled enclosure 2 when an abrupt change in pressure occurs in the enclosure 2, reference numeral 5 designates a pressure detector which is mounted to the oil-filled enclosure 2 to detect a change in the pressure of the insulating medium, reference numeral 6 designates a memory where changes in pressure during past trouble are stored, reference numeral 7 designates a processing unit which finds pressure and time characteristics from now on based on a pressure value given by the pressure detector 5 and the past information given by the memory 6, reference numeral 8 designates a determination processor which determines the presence and absence of trouble based on the calculation results given by the processing unit 7, and reference numeral 9 designates a relay circuit which operates depending on the calculation results given by the determination processor 8. Although a portion of the pressure releasing pipe 3 which is located on the side of the oil-filled enclosure 2 with respect to the pressure releasing plate 4 is filled with the oil, the remaining portion of the pressure releasing pipe 3 on the other side is open to the atmosphere.

The operation of the conventional apparatus will be explained. When internal short circuit has occurred in an oil-filled electrical equipment such as a transformer, the short-circuited portion generates heat to and decomposes the oil sealed as the insulating medium. If a portion of the oil evaporates, the hydraulic pressure in the oil-filled enclosure 2 could increase to break the oil-filled enclosure 2, causing leakage of oil and a fire. In order to cope with this problem, a rise in the hydraulic pressure is detected, and when the hydraulic pressure becomes high, the pressure releasing plate 4 is intentionally broken to release oil through the pressure releasing pipe 3, depressurizing the inside of the oil-filled enclosure 2.

The releasing operation will be described. First, the pressure in the oil-filled enclosure 2 is detected by the pressure detector 5. Only pressure values among the detected pressure values, which are beyond a certain threshold value, are inputted into the processing unit 7. This is because minute changes in pressure which occur in normal operation are ejected from being used as data for determination. Next, the processing unit 7 finds changes in pressure and time characteristics based on the inputted pressure values and the changes in pressure based on past trouble stored in the memory 6, and finds a time required for achieving an allowable pressure value against breakage of the oil-filled enclosure 2 or a pressure value which is attained in a certain period of time. The determination processor 8 compares the calculation results of the processing unit 7 with an initial set value, which corresponds to the time required for achieving the allowable pressure value, against breakage of the oil-filled enclosure 2 or the pressure value which is attained in such a certain period of time. If the found time or pressure value meets with the initial set value, it is determined that trouble has occurred, and the relay circuit 9 is activated to carry out the pressure releasing operation.

Since the conventional supervisory apparatus for an oil-filled electrical equipment is constructed as stated above, the pressure releasing operation is carried out when a detected pressure value is beyond a certain pressure value (absolute pressure of 2 $kg/cm^2$) and when the detected pressure value has achieved the certain pressure value in a short period of time (e.g., 1 $kg/cm^2/sec$). Although it is reasonable for the conventional apparatus to take action when an internal short circuit has occurred, the conventional apparatus has created a problem in that the pressure releasing operation is often carried out, even by a factor irrelevant to an internal short circuit, such as external short circuit, to improperly break the pressure releasing plate 4. If the pressure releasing plate is improperly broken, a large amount of expense is required for replacement of the broken pressure releasing plate, and it is necessary to find the cause of the improper pressure releasing operation.

SUMMARY OF THE INVENTION

It is an object of the present invention to solve these problems, and to provide a supervisory apparatus for an oil-filled electrical equipment capable of ensuring detection of internal short circuit in an oil-filled electrical equipment.

According to a first aspect of the present invention, there is provided a supervisory apparatus for an oil-filled electrical equipment, comprising a pressure detector for detecting a change in pressure of an insulating medium sealed in an oil-filled electrical equipment for insulation therefor; a vibration detector for detecting vibration of the oil-filled electrical equipment; and a determination processor for determining based on signal information detected by the pressure detector and the vibration detector whether an internal short circuit has occurred or not.

According to a second aspect of the present invention, the supervisory apparatus further comprises a transmission device for transmitting the determination by the determination processor to a host control system.

According to a third aspect of the present invention, there is provided a supervisory apparatus for an oil-filled electrical equipment, comprising a plurality of pressure detectors for detecting a change in pressure of an insulating medium sealed in an oil-filled electrical equipment for insulation therefor, a vibration detector for detecting vibration of the oil-filled electrical equipment, a determination process or for determining based on signal information detected by the pressure detectors and the vibration detector whether an internal short circuit has occurred or not, and an occurrence position estimation processor for estimating a probable occurrence position of the internal short circuit based on signal information detected by the pressure detectors when the determination processor determines that the internal short circuit has occurred.

According to a fourth aspect of the present invention, when a value found by differentiating a pressure value detected by the pressure detector is not less than a predetermined threshold value for pressure and when a value found by differentiating an acceleration value detected by the vibration detector is not higher than a predetermined threshold value for acceleration, the determination processor determines that the internal short circuit has occurred.

According to a fifth aspect of the present invention, the pressure detector is an absolute pressure type pressure sensor.

According to a six aspect of the present invention, the vibration detector is one of an acceleration sensor, a vibration sensor, an impact sensor, a speed sensor and a displacement sensor.

According to a seventh aspect of the present invention, the supervisory apparatus further comprise a memory for storing signal information from the pressure detector and the vibration detector.

According to an eighth aspect of the present invention, the supervisory apparatus further comprises a transmission device for transmitting the determination by the determination processor and the probable occurrence position of the internal short circuit estimated by the occurrence position estimation processor to a host control system.

According to a ninth aspect of the present invention, when the determination processor determines that the internal short circuit has occurred, the oil-filled electrical equipment is inoperative.

According to a tenth aspect of the present invention, the supervisory apparatus has a pressure reducing device provided for releasing pressure in the oil-filled electrical equipment outside when the determination processor determines that the internal short circuit has occurred.

In accordance with the first aspect, it is possible to offer an advantage in that detection of occurrence of the internal short circuit is ensured.

In accordance with the second aspect, it is possible to offer advantages in that the operating conditions of the oil-filled electrical equipment can be put under remote supervision and that past data can be accumulated in a mass storage device for analysis.

In accordance with the third aspect, it is possible to offer advantages in that detection of occurrence of the internal short circuit is ensured and that the probable occurrence position of the internal short circuit can be specified to facilitate repairing of the oil-filled electrical equipment.

In accordance with the fourth aspect, it is possible to offer an advantage in that detection of occurrence of the internal short circuit is ensured.

In accordance with the fifth aspect, it is possible to offer an advantage in that detection of occurrence of the internal short circuit is ensured.

In accordance with the sixth aspect, it is possible to offer an advantage in that detection of occurrence of the internal short circuit is ensured.

In accordance with the seventh aspect, it is possible to offer an advantage in that a high degree of determination can be carried out.

In accordance with the eighth aspect, it-is possible to offer advantages in that the oil-filled electrical equipment can be put under remote supervision and that a high degree of determination can be carried out.

In accordance with the ninth aspect, it is possible to offer an advantage in that the oil-filled electrical equipment can be prevented from being damaged when the internal short circuit has occurred.

In accordance with the tenth aspect, it is possible to offer an advantage in that a tank with the oil sealed therein can be prevented from being broken without raising pressure in an oil-filled enclosure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

EMBODIMENT 1

Figure 1:
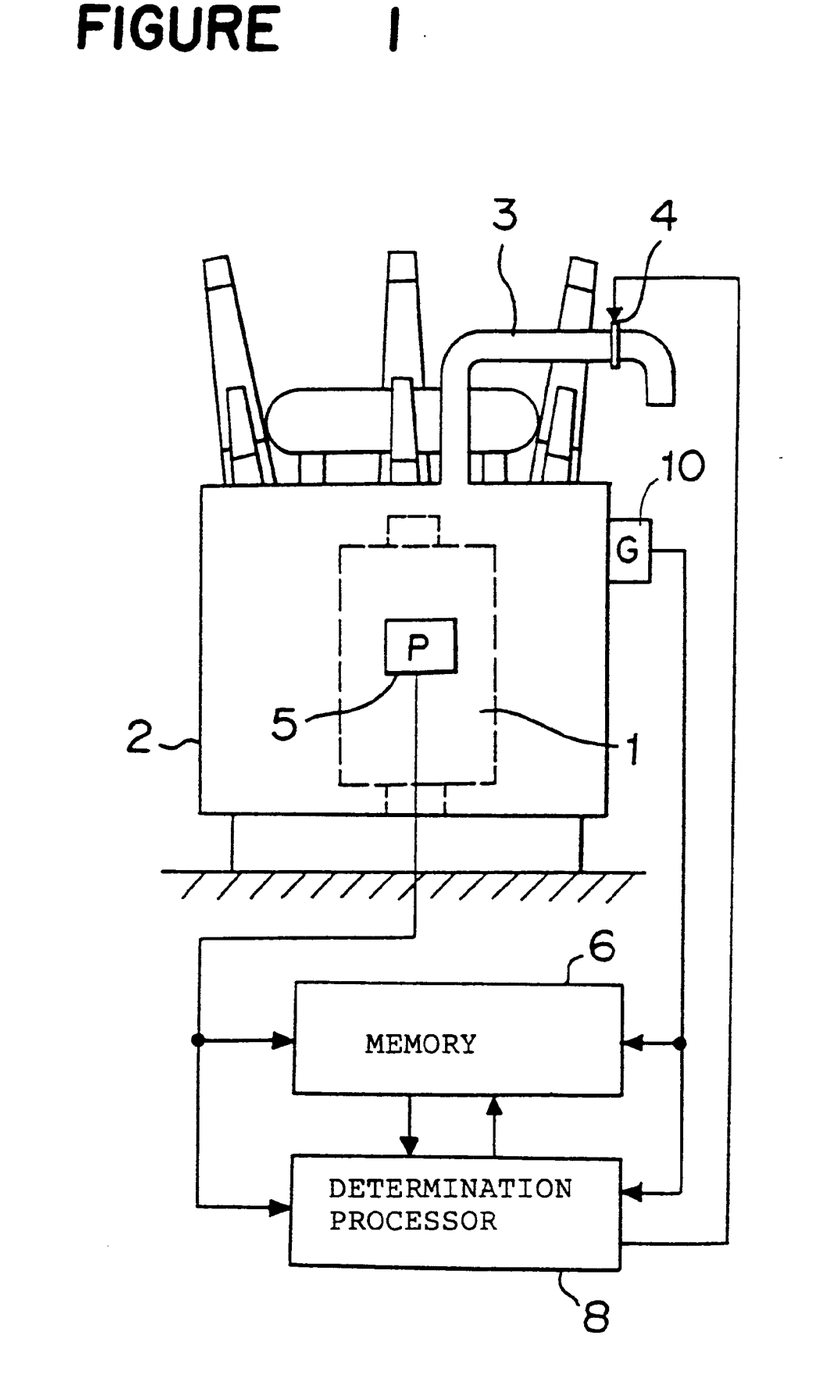
FIG. 1 is a schematic view showing a supervisory apparatus for an oil-filled electrical equipment according to a first embodiment of the present invention.

In FIG. 1 is shown a schematic view of the supervisory apparatus for an oil-filled electrical equipment according to a first embodiment of the present invention. In this Figure, reference numeral 1 designates a transformer, reference numeral 2 designates an oil-filled enclosure which has, e.g., oil as an insulating medium for the transformer 1 therein, reference numeral 3 designates a pressure releasing pipe which breaks a pressure releasing plate 4 to release the oil outside so as to depressurize the inside of the oil-filled enclosure 2 when an abrupt change in pressure in the oil-filled enclosure 2 occurs, reference numeral 5 designates a pressure detector which is provided in the oil-filled enclosure 2 to detect a change in pressure of the insulating medium, reference numeral 10 designates a vibration detector for detecting vibration of the oil-filled enclosure 2, reference numeral 6 designates a memory which receives signals from the pressure detector 5 and the vibration detector 10 and stores data such as signal waveforms, reference numeral 8 designates a determination processor which determines, based on the signals from the pressure detector 5 and the vibration detector 10 or a signal stored in the memory 6, whether an internal short circuit or an external short circuit has occurred. Although a portion of the pressure releasing pipe 3 which is located on the side of the oil-filled enclosure 2 with respect to the pressure releasing plate 4 is filled with the oil, the remaining portion of the pressure releasing pipe on the other side is open to atmosphere.

The pressure detector 5 may measure hydraulic pressure in terms of absolute pressure or gage pressure. However, it is not recommended that the pressure detector measure the hydraulic pressure in terms of gage pressure. This is because if a rise in pressure in the oil-filled enclosure 2 damages the detection portion in the pressure detector 5, the oil-filled enclosure 2 is opened intentionally to release the oil from the oil-filled enclosure 2. Considering this point, it is preferable to use an absolute pressure sensor in the present invention.

A device which can carry out measurement in a relatively high frequency band, not less than the 100 Hz, is appropriate as the vibration detector 10 because vibration which is whole number times as great as 50 Hz or 60 Hz noticeably exhibits an internal short circuit and an external short circuit.

A device which can carry out measurement to about 20 kHz can be used without trouble as well. Although an acceleration sensor for measuring vibration acceleration, a vibration sensor, and an impact sensor can be normally used as the vibration detector 10, a displacement sensor for measuring vibration displacement, a speed sensor for measuring vibration speed, and so on may be used.

The operation of the supervisory apparatus will be explained. First, a change in hydraulic pressure in the oil-filled enclosure 2 is detected by the pressure detector 5, and the vibration of the oil-filled enclosure 2 is detected by the vibration detector 10. The pressure detector 5 and the vibration detector 10 carry out measurement all the time. Measured data are not only stored in the memory 6 but also transmitted to the determination processor 8 every certain period of time (e.g., 1 min).

The determination, processor 8 determines, based on the data detected by the pressure detector 5 and the vibration detector 10, whether an internal short circuit has occurred or not. The determination processor 8 can directly utilize the data detected by the pressure detector 5 and the vibration detector 10 or utilize the data which have been stored in the memory 6. The memory 6 and the determination processor 8 may exchange the data all the time or as needed.

Figure 2:
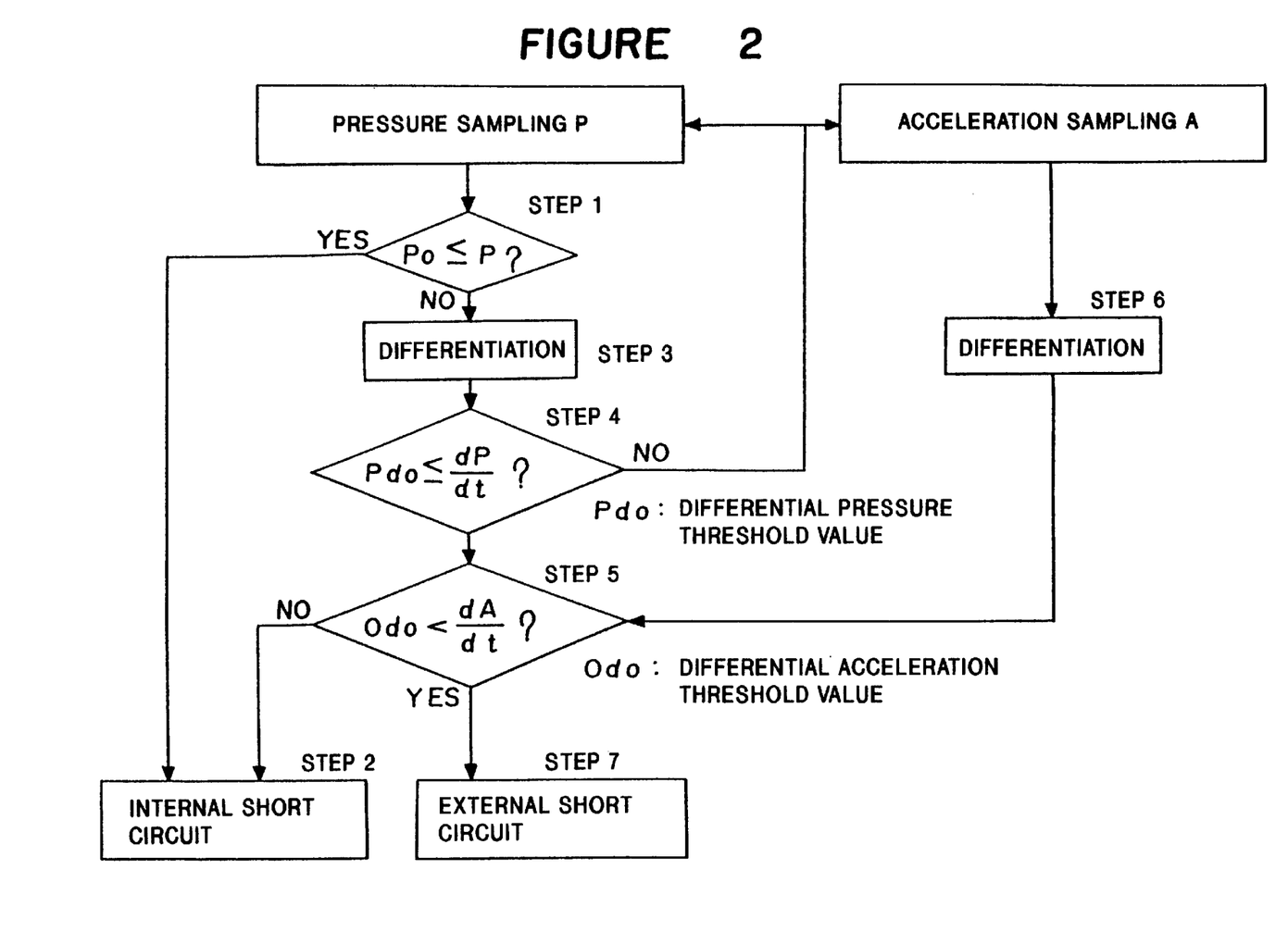
FIG. 2 is a flowchart showing the operation of the determination processor in the supervisory apparatus according to the first embodiment.

Next, the operation of the determination processor 8 will be explained. In FIG. 2 is shown a flowchart of the operation of the determination processor in the supervisory apparatus for an oil-filled electrical equipment according to the first embodiment of the present invention. First, it is determined whether a pressure value P detected by the pressure detector 5 is not less than a certain pressure threshold value $P_0$ (Step 1). The pressure threshold value $P_0$ is set to a high pressure value which is supposed to clearly indicate occurrence of an internal short circuit, e.g., a value of 3 kgf/cm² absolute pressure. If the detected pressure is not less than the pressure threshold value $P_0$, it is determined that the internal short circuit has occurred (Step 2). If the detected pressure value P is less than the pressure threshold value $P_0$, the detected pressure value P is differentiated (Step 3), and it is determined whether the differentiated value is not less than a certain differential pressure threshold value $Pd_0$ (Step 4). This determination determines whether the pressure has abruptly changed in a short period of time. If the differentiated pressure value is not less than the differential pressure threshold value $Pd_0$, it is determined that the pressure has abruptly changed in such short period of time, and then the process proceeds to Step 5. If the differentiated value is less than the differential pressure threshold value $Pd_0$, the determination ends because there has been no abrupt change in pressure, and the process will be repeated.

On the other hand, acceleration A detected by the vibration detector 10 is differentiated (Step 6). It is determined whether the differentiated acceleration value is greater than a certain differential acceleration threshold value $ad_0$ or not (Step 5). This determination determines whether the acceleration has abruptly changed in a short period of time or not. If the differentiated acceleration value is greater than the differential pressure threshold value $ad_0$, it is determined that the acceleration has abruptly changed in a short period of time, indicating occurrence of an external short circuit (Step 7). If the differentiated acceleration value is not greater than the differential acceleration threshold value $ad_0$, it is determined that an internal short circuit has occurred because the acceleration has not abruptly changed in such a short period of time (Step 2).

The process of the determination processor 8 is summarized as follows: An internal short circuit is determined to have occurred when the pressure value detected by the pressure detector 5 is not less than the certain value, or the acceleration detected by the vibration detector 10 has not changed in the short period of time though the detected pressure value has abruptly changed in the short period of time in a case wherein the detected pressure value is less than the certain value. On the other hand, an external short circuit is determined to have occurred when the detected pressure value is less than the certain value and when the detected pressure value and the detected acceleration have abruptly changed in the short period of time.

If the determination processor 8 determines that the internal short circuit has occurred, the pressure releasing plate 4 is broken to intentionally release the oil from the pressure releasing pipe 3 as in the conventional apparatus.

If it is determined that an internal short circuit has occurred or an external short circuit has occurred, signals before and after determination can be held in the memory 6.

Figure 3:
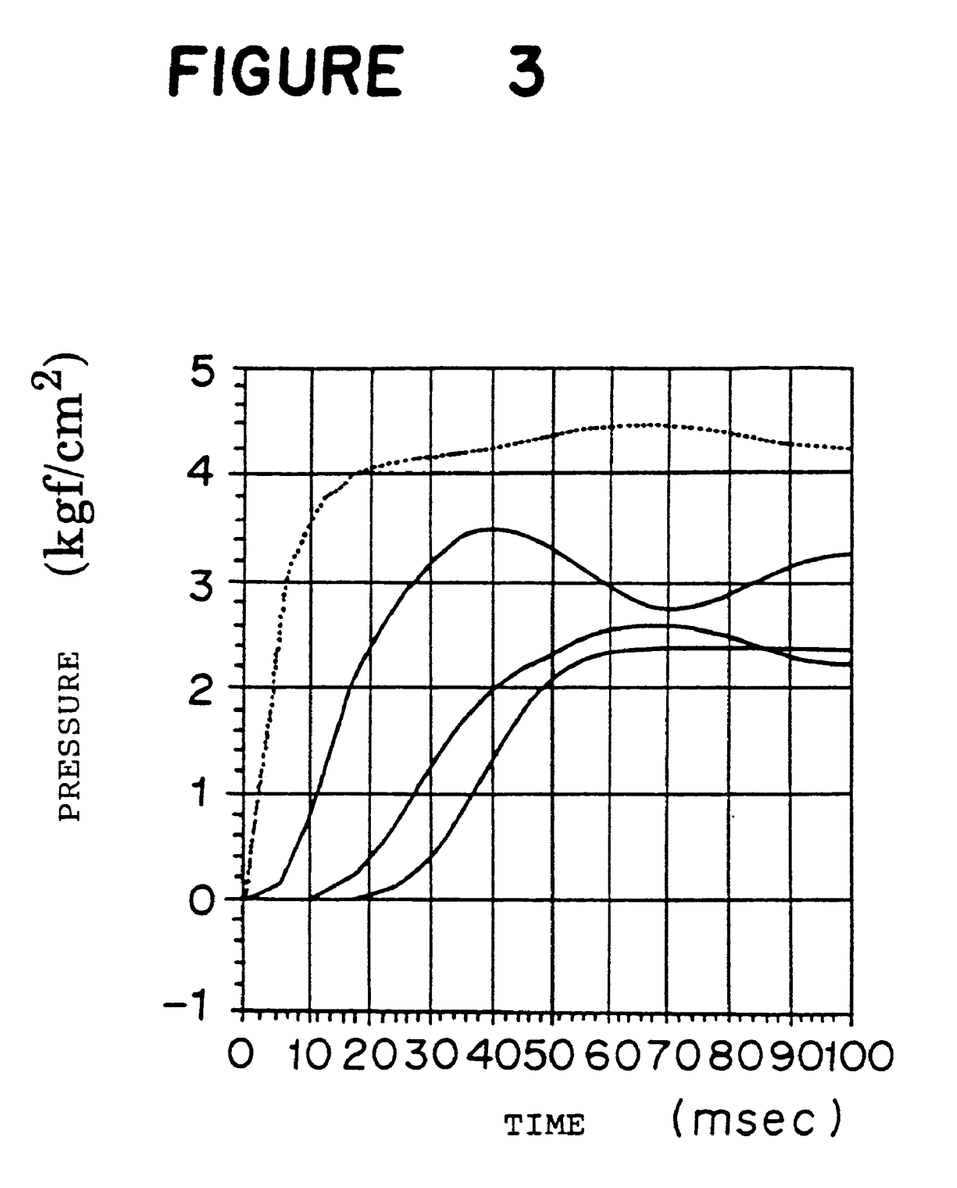
FIG. 3 is a waveform diagram showing changes in pressure on an internal short circuit.

Now, explanation of the waveforms of changes in pressure on an internal short circuit and the waveforms of changes in pressure and changes in acceleration on an external short circuit will be made for reference. FIG. 3 is a graph of analysis data which were obtained by providing the pressure detector 5 at four locations in the oil-filled enclosure 2 and simulating changes in pressure on occurrence of an internal short circuit. When the internal short circuit has occurred, the short-circuited portion generates heat and decomposed the oil sealed in the enclosure. At that time, a portion of the oil evaporates to monotonically increase the hydraulic pressure in the oil-filled equipment. Although the presence of pulsation in the changes in pressure in and after 30 msec is shown in FIG. 3 because of analysis data, not actually measured data, it is normally supposed that the hydraulic pressure does not decrease in the sealed space as a matter of fact. As shown in FIG. 3, it is seen that pressure values abruptly increased in a short period of time in response to an internal short circuit. Although the vibration data obtained by the vibration detector 10 are not shown here, no abrupt change in a short period of time was observed in comparison with the vibration data on the external short circuit stated below.

Figure 4A:
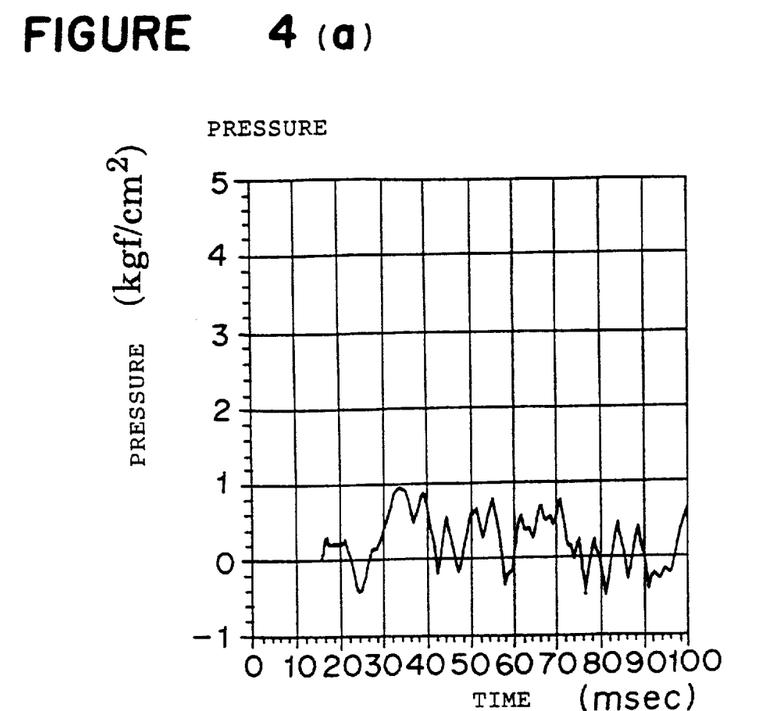
FIG. 4 is a waveform diagram showing changes in pressure and changes in acceleration on an external short circuit.
Figure 4B:
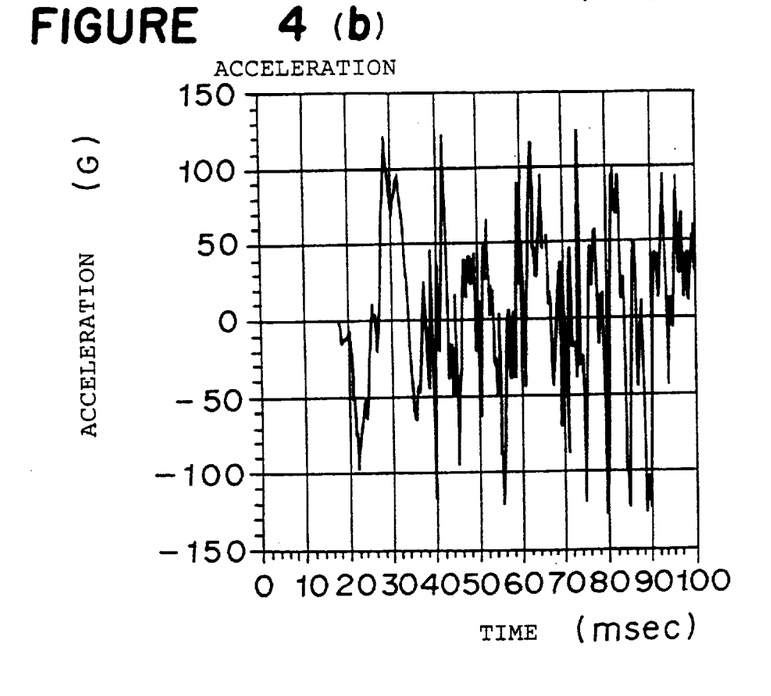

In FIG. 4(a) is shown a graph of actually measured data which were obtained by experimentally simulating changes in pressure on occurrence of an external short circuit (lightning). In FIG. 4(b) is shown a graph of the actually measured data which were obtained by experimentally simulating changes in acceleration on occurrence of the external short circuit. If a surge current due to the external short circuit (lightning) flows into the transformer 1, the coil is vibrated by an electromagnetic force applied thereto, the oil in the oil-filled enclosure 2 is also vibrating by the vibrated coil, and the hydraulic pressure values detected by the pressure detector 5 and the vibration data obtained by the vibration detector 10 pulse including suitable increases. It is shown in FIG. 4(a) that the pressure values were not so high though the external short circuit causes abrupt changes in pressure in a short period of time as in the case of the internal short circuit shown in FIG. 3. It is seen from FIG. 4(b) that the vibration data obtained by the vibration detector 10 included positive and negative acceleration even within a period of 10 msec, an extremely short period of time.

Although explanation of the operation of the determination processor 8 in the first embodiment has been made with respect to a case wherein the single pressure detector 5 and the single vibration detector 10 are provided, a plural number of the pressure detectors 5 and a plural number of the vibration detectors 10 may be provided. In determination with the plural pressure detectors and the plural vibration detectors, the maximum value among the plural data or the maximum differentiated value may be selected as basis for the determination. The determination may be made with the plural data combined or multiplied.

Although the main purpose of the supervisory apparatus for an oil-filled electrical equipment according to the present invention is to detect an internal short circuit, an additional vibration detector 10 which can detect vibration in a relatively low band to collect vibration data such as an earth tremor and an earthquake may be provided, and such vibration data may be stored in the memory 6. The data which have been measured by the pressure detector 5 and the vibration detector 10 on the external short circuit may be stored in the memory 6 though the measured data are not related to occurrence of an internal short circuit.

As explained, in accordance with the first embodiment, there are provided the pressure detector 5 for detecting a change in pressure of the insulating medium, the vibration detector 10 for detecting vibration of the oil-filled enclosure 2, and the determination processor 8 which determines the presence and absence of an internal short circuit based on signal information detected by the pressure detector 5 and the vibration detector 10. Detection of occurrence of the internal short circuit is ensured.

EMBODIMENT 2

Figure 5:
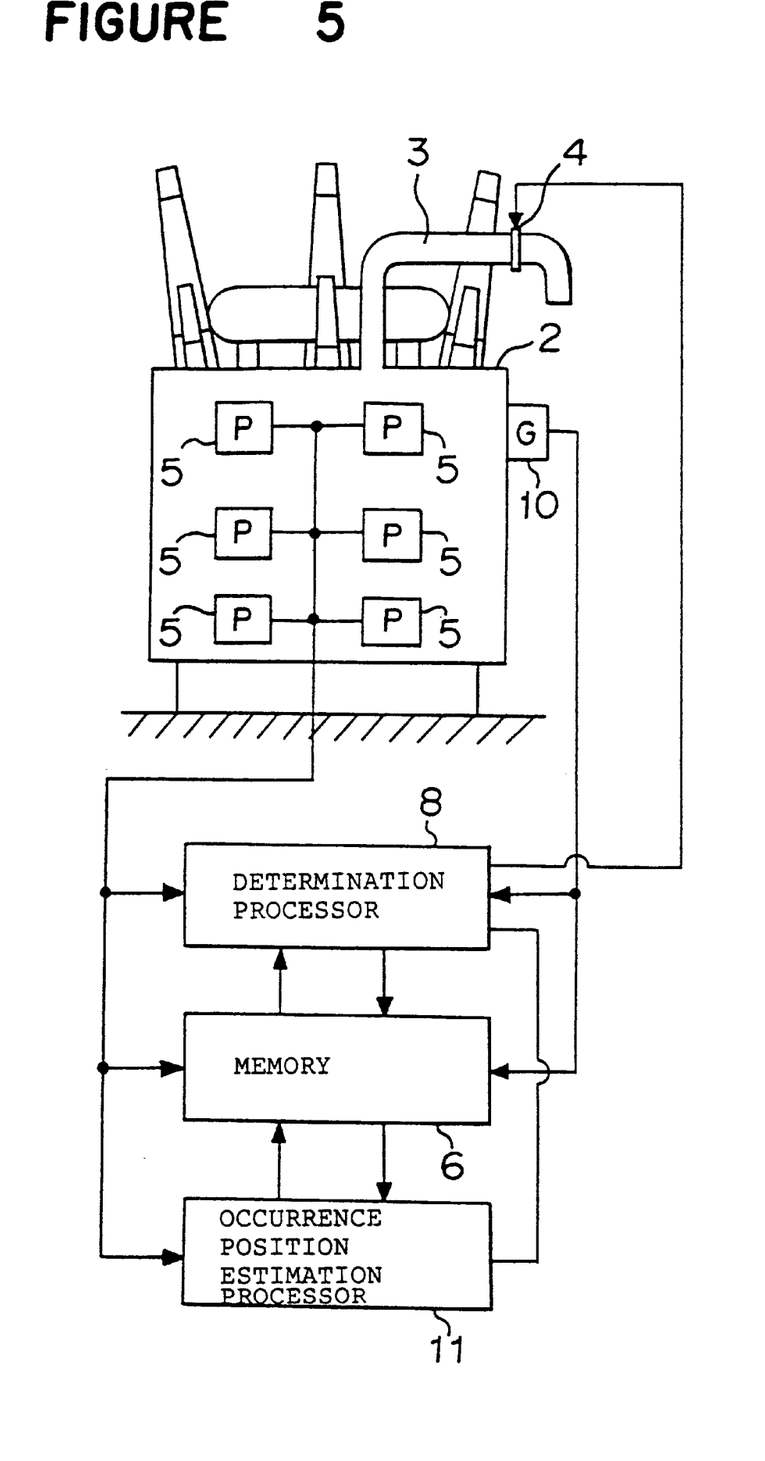
FIG. 5 is a schematic view showing a supervisory apparatus for an oil-filled electrical equipment according to a second embodiment of the present invention.

In FIG. 5 is shown a schematic view of the supervisory apparatus for an oil-filled electrical equipment according to a second embodiment of the present invention. In this Figure, reference numeral 11 designates an occurrence position estimation processor which estimates a probable occurrence position of an internal short circuit when the determination processor 8 determines that the internal short circuit has occurred.

When pressure detectors 5 are provided at plural locations in the oil-filled enclosure 2, it is supposed that the pressure detector 5 closest to the occurrence of an internal short circuit indicates the highest pressure value as shown in FIG. 3. For this reason, the pressure detectors 5 are provided at plural locations as shown in FIG. 5. If the determination processor 8 determines that an internal short circuit has occurred, the occurrence position estimation processor 11 estimates that the probable position of the internal short circuit is the location nearest to the pressure detector 5, among the plural pressure detectors 5, which has indicated an abrupt raise in hydraulic pressure first or which has detected a pressure value beyond a certain value, e.g., absolute pressure of 2 kgf/cm$^2$, first. Thus the occurrence position of the internal short circuit can be specified to some extent, facilitating repairing of the transformer 1.

Although the determination processor 8 and the occurrence position estimation processor 11 are shown to be different processing units in this embodiment, the determination processor and the occurrence position estimation processor may be formed in a single processing unit.

EMBODIMENT 3

Figure 6:
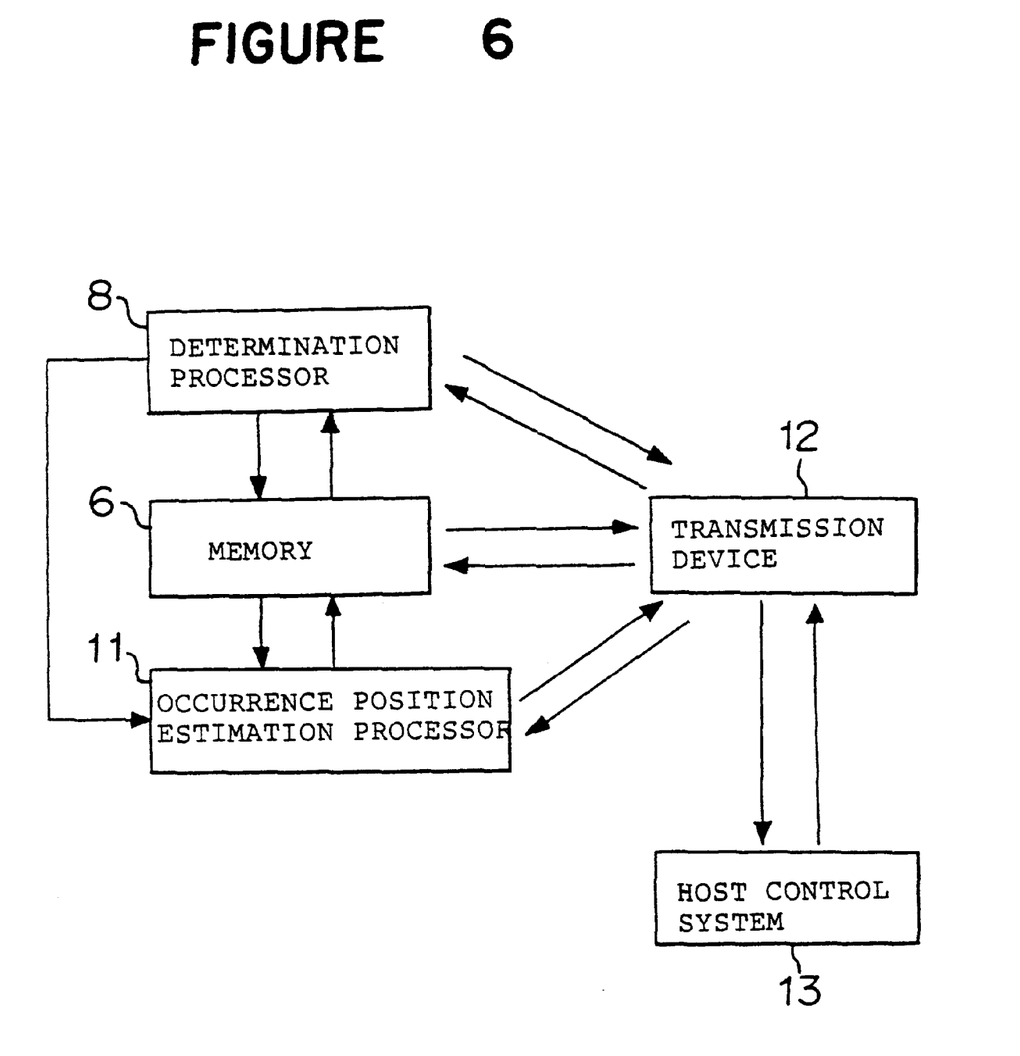
FIG. 6 is a block diagram showing a supervisory apparatus for an oil-filled electrical equipment according to a third embodiment of the present invention.

In FIG. 6 is shown a block diagram of the supervisory apparatus for an oil-filled electrical equipment according to a third embodiment of the present invention. In this Figure, reference numeral 12 designates a transmission device which transmits the determination made by the determination processor 8, the probable occurrence position of an internal short circuit estimated by the occurrence position estimation processor 11 and the signal waveforms stored in the memory 6 to a host control system 13.

A specific example of the transmission device 12 having two-way telecommunication function is a wired cable for transmission, such as a field bus according to quasi-international standard and radio communication. Examples of the host control system 13 include a monitoring room for supervising a plurality of transformers 1 at the same time, and a monitor station which carries out centralized supervision at a remote location.

The host control system 13 includes a storage medium having a high-capacity which significantly exceeds the capacity of the memory 6. The host control system can provide a higher degree of arithmetic manipulation than the determination processor 8 or the occurrence position estimation processor 11.

By accumulating the measured values detected by the pressure detector 5 and the vibration detector 10 in the host control system 13 all the time, a warning of occurrence of an internal short circuit can be detected based on the hydraulic pressure data and the vibration data which have been stored in the past.

For example, if one of the pressure detectors 5 detects an abnormal signal due to deterioration or failure, the host control system 13 can command the determination processor 8 or the occurrence position estimation processor 11 to carry out supervision based on data, except for the data obtained by the pressure detector 5, which is determined to be out of order. The two-way telecommunication allows the host control system 13 to transmit commands to the determination processor 8 or the occurrence position estimation processor 11.

EMBODIMENT 4

In accordance with the first embodiment, the pressure releasing plate 4 is intentionally broken to release the oil through the pressure releasing pipe 3 so as to reduce the pressure in the oil-filled enclosure 2 when it is determined that an internal short circuit has occurred. In accordance with a fourth embodiment of the present invention, when the determination processor 8 determines that an internal short circuit has occurred, the determination processor 8 transmits a signal to open a breaker connecting the transformer 1 and a power system, stopping the operation of the transformer 1. By this arrangement, the pressure releasing pipe 3 and the pressure releasing plate 4 can be omitted, and the operation of the transformer 1 per se can be stopped, preventing the transformer 1 from being damaged due to pressurization.

EMBODIMENT 5

Figure 7:
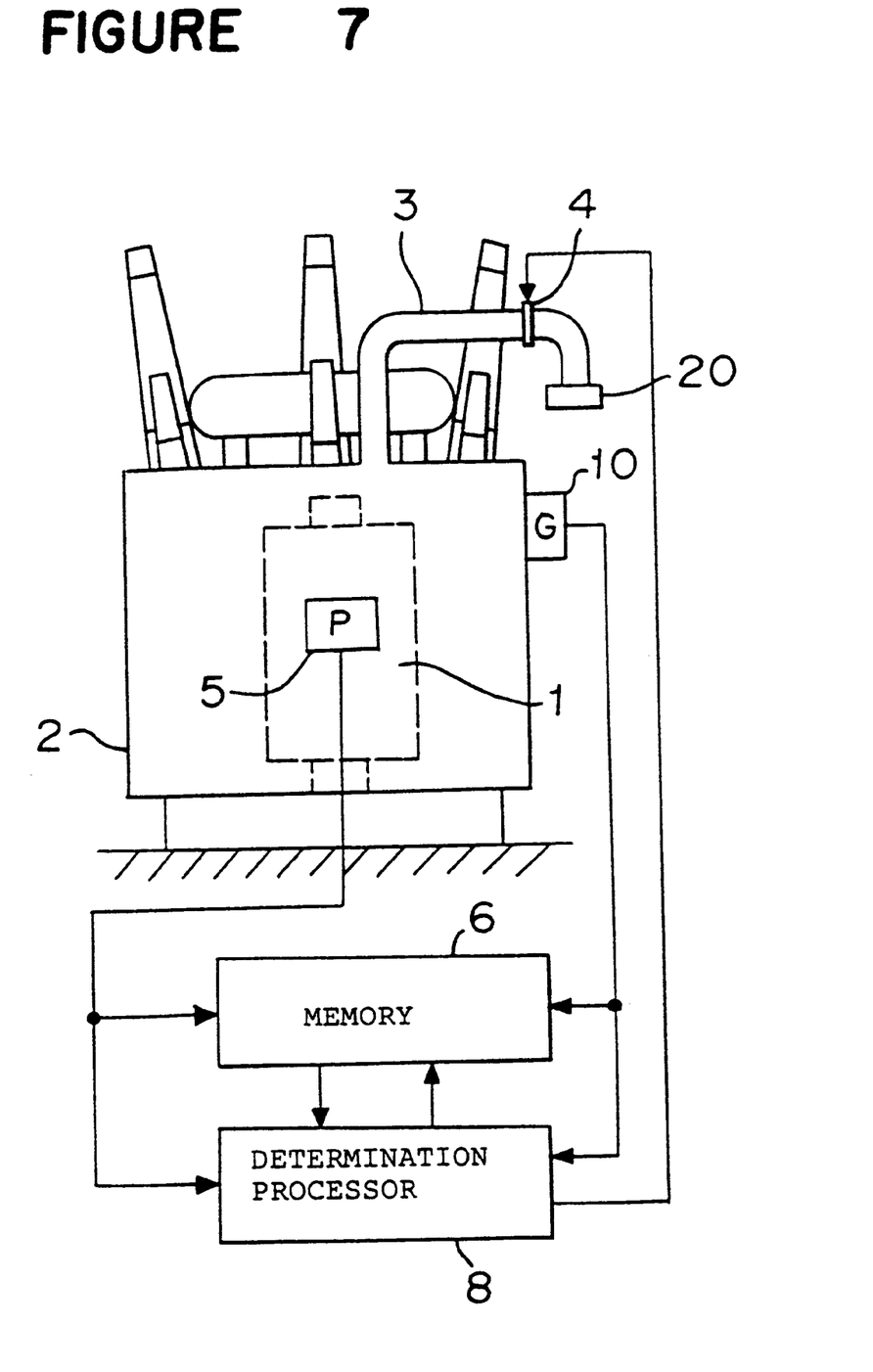
FIG. 7 is a schematic view showing a supervisory apparatus for an oil-filled electrical equipment according to a fifth embodiment of the present invention.

In accordance with this embodiment, the pressure releasing pipe 3 has a leading edge provided with a pressure reducing device 20 as shown in FIG. 7. A solenoid valve which is normally used and a pressure reducing chamber which is filled with gas, such as nitrogen, are included in the pressure reducing device. If the determination processor 8 determines that an internal short circuit has occurred, the solenoid valve can be opened to release the oil from the oil-filled enclosure 2, reducing the hydraulic pressure using the pressure reducing chamber filled with gas such as nitrogen. Thus, a raise in hydraulic pressure in the oil-filled enclosure 2 can be minimized to protect a tank with the oil sealed therein against breakage.

Liquid is different from gas in that even slight volume expansion, e.g., expansion by a ratio of volume of 1%, causes a change in pressure exceeding 10 kgf/cm$^2$. If the pressure reducing chamber has a volume which is at least 1% of the volume of the oil-filled enclosure 2, the pressure reducing chamber can function in a sufficient way.

Obviously, numerous modifications and variations of the present invention are possible in light of the above teachings. It is therefore to be understood that within the scope of the appended claims, the invention may be practiced otherwise than as specifically described herein.

What is claimed is:

1. A supervisory apparatus for oil-filled electrical equipment, comprising:

a pressure detector for detecting a change in pressure of an insulating medium sealed in an oil-filled electrical equipment;

a vibration detector for detecting vibration of the oil-filled electrical equipment; and a determination processor for determining, based on information detected by the pressure detector and the vibration detector, whether an internal short-circuit has occurred in the oil-filled electrical equipment.

2. The supervisory apparatus according to claim 1, further comprising a transmission device for transmitting a determination by the determination processor to a host control system.

3. The supervisory apparatus according to claim 1, wherein, when a value found by differentiating pressure detected by the pressure detector is not less than a threshold value for pressure and when a value found by differentiating acceleration detected by the vibration detector is not higher than a threshold value for acceleration, the determination processor determines that an internal short circuit has occurred.

4. The supervisory apparatus according to claim 1, wherein the pressure detector is an absolute pressure sensor.

5. The supervisory apparatus according to claim 1, wherein the vibration detector is one of an acceleration sensor, a vibration sensor, an impact sensor, a speed sensor, and a displacement sensor.

6. The supervisory apparatus according to claim 1, further comprising a memory for storing information from the pressure detector and from the vibration detector.

7. The supervisory apparatus according to claim 1, wherein, when the determination processor determines that an internal short circuit has occurred, the oil-filled electrical equipment is made inoperative.

8. The supervisory apparatus according to claim 1, including a pressure reducing device for releasing pressure in the oil-filled electrical equipment when the determination processor determines that an internal short circuit has occurred.

9. The supervisory apparatus according to claim 1, wherein the pressure detector comprises a plurality of pressure detectors and an occurrence position estimation processor for estimating a probable location of an internal short circuit based on information detected by the pressure detectors when the determination processor determines that an internal short circuit has occurred.

10. The supervisory apparatus according to claim 9, wherein, when a value found by differentiating pressure detected by the pressure detector is not less than a threshold value for pressure and when a value found by differentiating acceleration detected by the vibration detector is not higher than a threshold value for acceleration, the determination processor determines that an internal short circuit has occurred.

11. The supervisory apparatus according to claim 9, wherein the pressure detector is an absolute pressure sensor.

12. The supervisory apparatus according to claim 9, wherein the vibration detector is one of an acceleration sensor, a vibration sensor, an impact sensor, a speed sensor, and a displacement sensor.

13. The supervisory apparatus according to claim 9, further comprising a memory for storing information from the pressure detector and from the vibration detector.

14. The supervisory apparatus according to claim 9, further comprising a transmission device for transmitting a determination by the determination processor and the probable location of an internal short circuit estimated by the occurrence position estimation processor to a host control system.

15. The supervisory apparatus according to claim 9, wherein, when the determination processor determines that a internal short circuit has occurred, the oil-filled electrical equipment is made inoperative.

16. The supervisory apparatus according to claim 9, including a pressure reducing device for releasing pressure in the oil-filled electrical equipment when an determination processor determines that the internal short circuit has occurred.

17. The supervisory apparatus according to claim 1, wherein, when a value found by differentiating pressure detected by the pressure detector is not less than a threshold value for pressure, and when a value found by differentiating acceleration detected by the vibration detector is higher than a threshold value for acceleration, the determination processor determines that an external short-circuit has occurred.

18. An oil-filled electrical apparatus comprising:

a sealed vessel;

electrical equipment disposed inside the sealed vessel;

oil, as an electrically insulating medium, filling the sealed vessel;

a pressure detector for detecting a change in pressure of the insulating medium in the vessel;

a vibration detector for detecting vibration of the oil-filled electrical apparatus; and a determination processor for determining, based on information detected by the pressure detector and the vibration detector, whether a short-circuit has occurred in the electrical equipment.

19. The oil-filled electrical apparatus according to claim 18, wherein, when a value found by differentiating pressure detected by the pressure detector is not less than a threshold value for pressure, and when a value found by differentiating acceleration detected by the vibration detector is not higher than a threshold value for acceleration, the determination processor determines that an internal short-circuit has occurred.

20. The oil-filled electrical apparatus according to claim 18, wherein, when a value found by differentiating pressure detected by the pressure detector is not less than a threshold value for pressure, and when a value found by differentiating acceleration detected by the vibration detector is higher than a threshold value for acceleration, the determination processor determines that an external short-circuit has occurred.

* * * * *